US012796166B2

(12) United States Patent
Kamikawa

(10) Patent No.: US 12,796,166 B2
(45) Date of Patent: Nov. 10, 2026

(54) TEMPLATE SUBSTRATE, SEMICONDUCTOR SUBSTRATE

(71) Applicant: KYOCERA Corporation, Kyoto (JP)

(72) Inventor: Takeshi Kamikawa, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 608 days.

(21) Appl. No.: 18/278,193

(22) PCT Filed: Feb. 22, 2022

(86) PCT No.: PCT/JP2022/007132

§ 371 (c)(1),
(2) Date: Aug. 22, 2023

(87) PCT Pub. No.: WO2022/181584

PCT Pub. Date: Sep. 1, 2022

(65) Prior Publication Data

US 2024/0145622 A1 May 2, 2024

(30) Foreign Application Priority Data

Feb. 26, 2021 (JP) ................................. 2021-031035

(51) Int. Cl.

| | |
|---|---|
| ***H10H 20/01*** | (2025.01) |
| ***C30B 25/04*** | (2006.01) |

(Continued)

(52) U.S. Cl.

CPC ....... *H10H 20/01335* (2025.01); *C30B 25/04* (2013.01); *C30B 29/406* (2013.01); *H10H 20/817* (2025.01); *H10H 20/825* (2025.01); *H10P 14/271* (2026.01); *H10P 14/276* (2026.01); *H10P 14/2905* (2026.01);

(Continued)

(58) Field of Classification Search

CPC ........... H10H 20/01335; H10H 20/817; H10H 20/825; C30B 25/04; C30B 29/406; H10P 14/271; H10P 14/276; H10P 14/2905; H10P 14/3416; H10P 14/272; H10P 14/3216; H10P 14/2926; H10P 14/3254;

(Continued)

(56) References Cited

U.S. PATENT DOCUMENTS

| | | | |
|---|---|---|---|
| 2010/0099290 | A1 | 4/2010 | Gastineau |
| 2010/0261361 | A1 | 10/2010 | Kasparian et al. |

(Continued)

FOREIGN PATENT DOCUMENTS

| | | | |
|---|---|---|---|
| JP | 2000-294827 | A | 10/2000 |
| JP | 2011-066390 | A | 3/2011 |

(Continued)

*Primary Examiner* — John P. Dulka

(74) *Attorney, Agent, or Firm* — Volpe Koenig

(57) ABSTRACT

A template substrate includes: a main substrate including an edge (E), a peripheral portion including the edge, and a non-peripheral portion located on the inner side of the peripheral portion; and a mask pattern located above the main substrate. The mask pattern includes a mask portion, a plurality of first opening portions (KF) each having a width direction as a first direction and a longitudinal direction as a second direction and overlapping the non-peripheral portion in plan view, and one or more second opening portions (KB) arranged along the edge in plan view.

19 Claims, 17 Drawing Sheets

(51) Int. Cl.

| | |
|---|---|
| ***C30B 29/40*** | (2006.01) |
| ***H01S 5/02*** | (2006.01) |
| ***H10H 20/817*** | (2025.01) |
| ***H10H 20/825*** | (2025.01) |
| ***H10P 14/20*** | (2026.01) |
| ***H10W 90/00*** | (2026.01) |

(52) U.S. Cl.
CPC ......... *H10P 14/3416* (2026.01); *H10W 90/00* (2026.01); *H01S 5/021* (2013.01)

(58) Field of Classification Search
CPC .. H10W 90/00; H01S 5/021; H01S 5/320275; H01S 5/34333; H01S 2304/12
See application file for complete search history.

(56) References Cited

U.S. PATENT DOCUMENTS

| | | | | |
|---|---|---|---|---|
| 2012/0280363 | A1* | 11/2012 | Sumida | C30B 29/406 257/E29.089 |
| 2013/0168733 | A1 | 7/2013 | Iwanaga et al. | |
| 2014/0147650 | A1 | 5/2014 | Jiang et al. | |
| 2017/0263440 | A1* | 9/2017 | Schulze | H10P 14/2925 |
| 2019/0189438 | A1* | 6/2019 | Mikawa | H10P 14/2908 |
| 2020/0308687 | A1 | 10/2020 | Li et al. | |

FOREIGN PATENT DOCUMENTS

| | | | |
|---|---|---|---|
| JP | 2012-134243 | A | 7/2012 |
| JP | 2019526707 | A | 9/2019 |
| WO | 2012144212 | A1 | 10/2012 |
| WO | 2018/030311 | A1 | 2/2018 |

* cited by examiner

TEMPLATE SUBSTRATE, SEMICONDUCTOR SUBSTRATE

TECHNICAL FIELD

The present invention relates to a template substrate and the like.

BACKGROUND OF INVENTION

Patent Document 1 discloses a method of forming a plurality of semiconductor parts, each of the plurality of semiconductor parts corresponding to a respective one of a plurality of opening portions of a mask by using an epitaxial lateral overgrowth (ELO) method.

CITATION LIST

Patent Literature

Patent Document 1: JP 2011-66390 A

SUMMARY

In the present disclosure, a template substrate includes: a main substrate including an edge, a peripheral portion including the edge, and a non-peripheral portion located on the inner side of the peripheral portion; and a mask pattern located above the main substrate. The mask pattern includes a mask portion, a plurality of first opening portions each having a width direction as a first direction and a longitudinal direction as a second direction and overlapping the non-peripheral portion in plan view, and one or more second opening portions arranged along the edge in plan view.

DESCRIPTION OF EMBODIMENTS

Template Substrate

Figure 1:
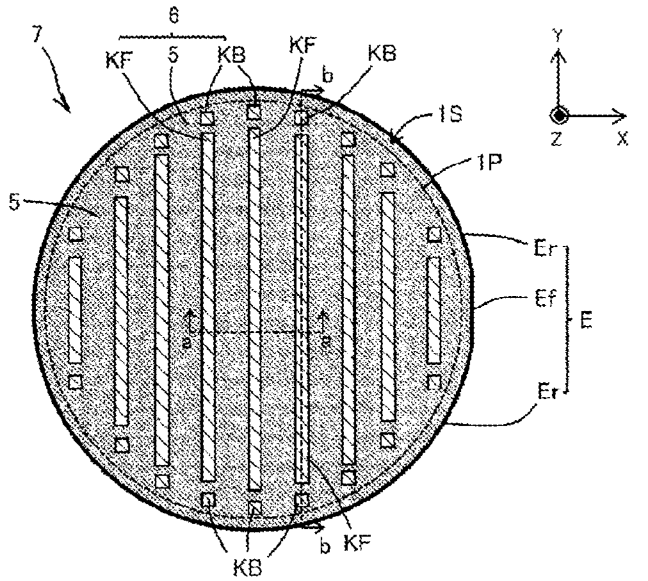
FIG. 1 is a plan view illustrating a configuration of a template substrate according to the present embodiment.
Figure 2:
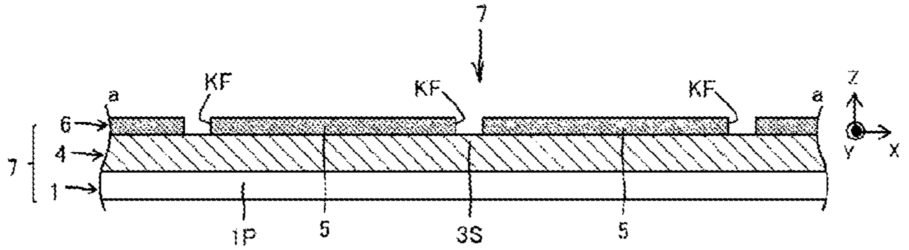
FIG. 2 is a cross-sectional view (a non-peripheral portion) taken along an arrow line a-a illustrated in FIG. 1.
Figure 3:
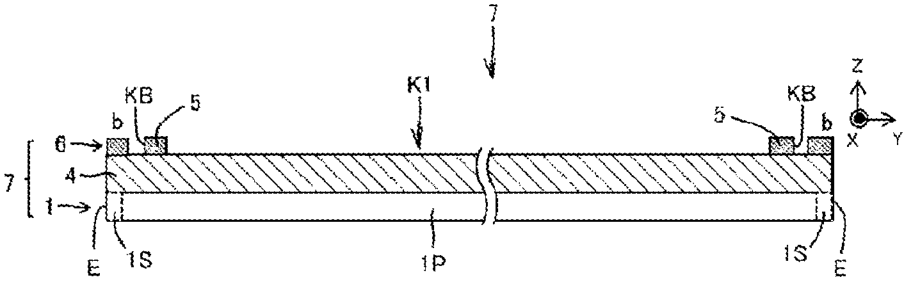
FIG. 3 is a cross-sectional view (a peripheral portion) taken along an arrow line b-b illustrated in FIG. 1.

FIG. 1 is a plan view illustrating a configuration of a template substrate according to the present embodiment. FIG. 2 is a cross-sectional view (a non-peripheral portion) taken along an arrow line a-a illustrated in FIG. 1. FIG. 3 is a cross-sectional view (a peripheral portion) taken along an arrow line b-b illustrated in FIG. 1.

As illustrated in FIG. 1, a template substrate 7 according to the present embodiment includes a main substrate 1 and a mask pattern 6 (mask layer), the main substrate 1 including an edge E (end surface, side surface), a peripheral portion 1S including the edge E, and a non-peripheral portion 1P located on the inner side of the peripheral portion 1S, and the mask pattern 6 being located above the main substrate 1. The mask pattern 6 includes a mask portion 5, a plurality of first opening portions KF each having a width direction as a first direction (X direction) and a longitudinal direction as a second direction (Y direction) and overlapping the non-peripheral portion in plan view, and a plurality of second opening portions KB arranged along the edge E in plan view. The template substrate 7 can be used for formation of a semiconductor part (semiconductor layer), for example, for film formation of a GaN-based semiconductor part (GaN-based semiconductor crystal) by epitaxial lateral overgrowth (ELO) method.

In FIG. 1, the edge E (side surface, end surface) of the main substrate 1 includes a curved surface Er and a flat surface Ef, but the configuration is not limited thereto, and the edge E may include only a curved surface or a flat surface.

Each of the first opening portions KF overlaps the non-peripheral portion 1P in plan view. The entirety of each of the first opening portions KF may be located in the non-peripheral portion 1P, or a part of each of the first opening portions KF may be located in the peripheral portion 1S and the remaining part may be located in the non-peripheral portion 1P.

The plurality of second opening portions KB are arranged along the edge E in plan view. The entirety of each of the second opening portions KB may be located in the non-peripheral portion 1P, the entirety of each of the second opening portions KB may be located in the peripheral portion 15, or a part of each of the second opening portions KB may be located in the non-peripheral portion 1P and the remaining part may be located in the peripheral portion 1S.

The mask pattern 6 includes the plurality of second opening portions KB in FIG. 1, but the configuration is not limited thereto, and the number of the second opening portions KB may be one. The shape of the second opening portion KB may be a rectangle having a longitudinal direction as the Y direction or the X direction, a square, a circle, or an annular or curved longitudinal shape. One and another one of the plurality of second opening portions KB may have a shape different from each other. For example, the mask pattern 6 may include the plurality of second opening portions KB having different lengths in the X direction and/or the Y direction, or may include an annular second opening portion KB and a rectangular second opening portion KB.

The template substrate 7 may include an underlying layer 4 including a seed layer 3 above the main substrate 1, and at least the first opening portions KF and the second opening portions KB expose a seed portion 3S of the seed layer 3. The first opening portions KF and the second opening portions KB may have a tapered shape (a shape in which the width becomes narrower toward the underlying layer 4 side).

In the template substrate 7 in FIG. 1, a plurality of layers are layered on the main substrate 1, and the layering direction may be referred to as an "upward direction". Viewing a substrate-like object such as the template substrate 7 with a line of sight parallel to the substrate normal line may be referred to as "plan view".

Figure 4:
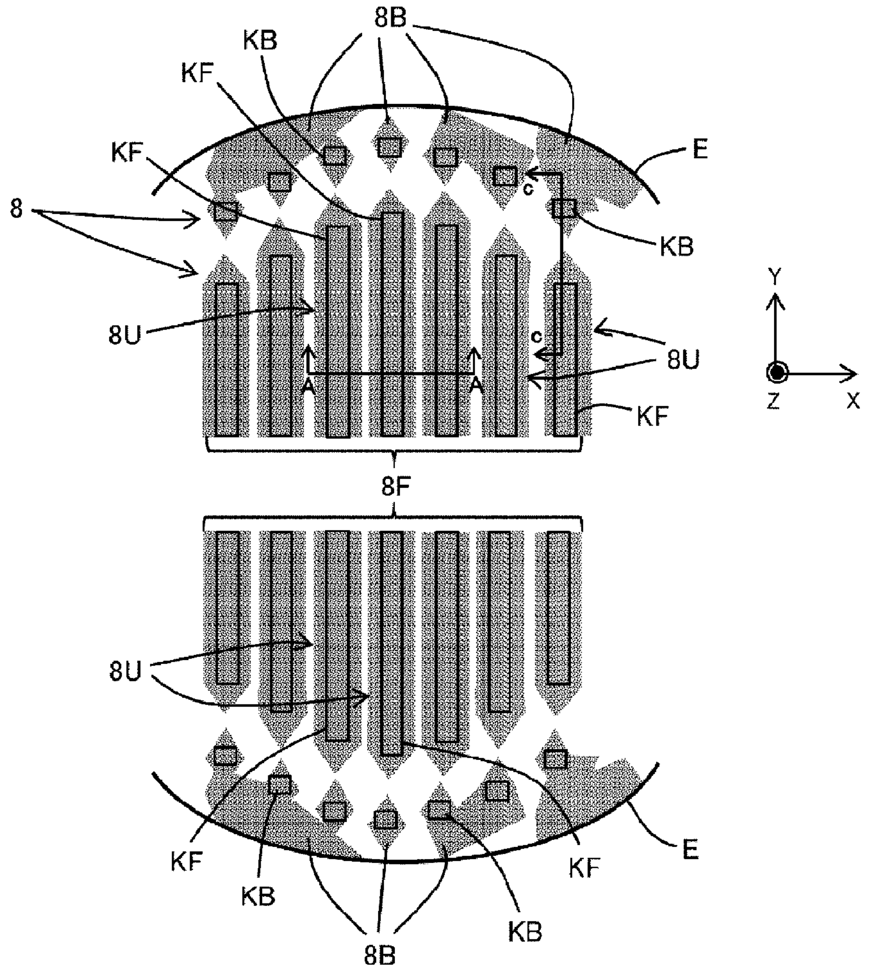
FIG. 4 is a plan view illustrating a configuration of a semiconductor substrate according to the present embodiment.
Figure 5A:
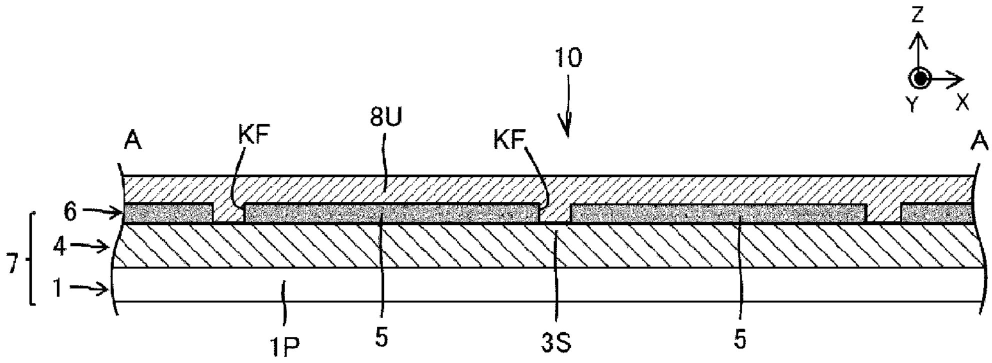
FIG. 5A is a cross-sectional view taken along an arrow line A-A illustrated in FIG. 4.
Figure 5B:
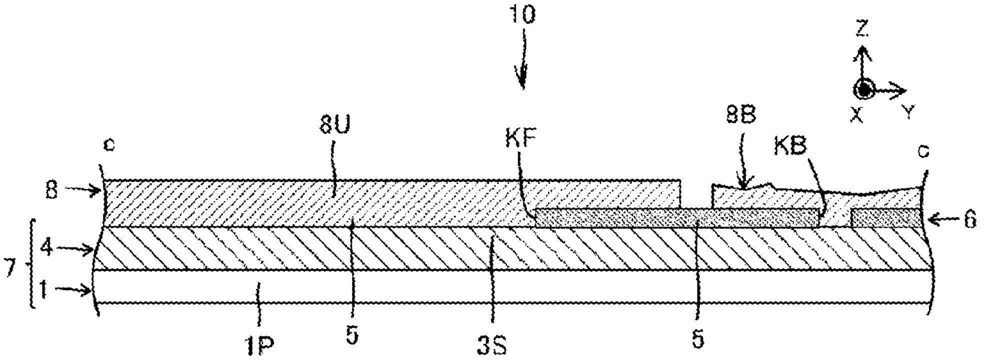
FIG. 5B is a cross-sectional view taken along an arrow line c-c illustrated in FIG. 4.

Semiconductor Substrate FIG. 4 is a plan view illustrating a configuration of a semiconductor substrate according to the present embodiment. FIG. 5A is a cross-sectional view taken along an arrow line A-A illustrated in FIG. 4. FIG. 5B is a cross-sectional view taken along an arrow line c-c illustrated in FIG. 4. As illustrated in FIGS. 4, 5A and 5B, the semiconductor substrate 10 includes the template substrate 7 and a first semiconductor part 8F and a second semiconductor part 8B located above the mask pattern 6. The semiconductor substrate refers to a substrate including a semiconductor part, and the main substrate 1 may be a semiconductor or a non-semiconductor. The first semiconductor part 8F and/or the second semiconductor part 8B may be a layered semiconductor layer.

The first and second semiconductor parts 8F and 8B each contain, for example, a nitride semiconductor. The nitride semiconductor may be expressed, for example, by AlxGayInzN ($0 \le x \le 1$; $0 \le y \le 1$; $0 \le z \le 1$; $x+y+z=1$). Specific examples of the nitride semiconductor may include a GaN-based semiconductor, aluminum nitride (AlN), indium aluminum nitride (InAlN), and indium nitride (InN). The GaN-based semiconductor is a semiconductor containing gallium atoms (Ga) and nitrogen atoms (N). Typical examples of the GaN-based semiconductor may include GaN, AlGaN, AlGaInN, and InGaN. The first and second semiconductor parts 8F and 8B each may be of a doped type (for example, an n-type including a donor) or a non-doped type.

The first and second semiconductor parts 8F and 8B containing the nitride semiconductor can be formed by the ELO method. In the ELO method, for example, a heterogeneous substrate different from the GaN-based semiconductor in lattice constant is used as the main substrate 1, the GaN-based semiconductor is used as the seed portion 3S, an inorganic compound film is used as the mask pattern 6, and the first and second semiconductor parts 8F and 8B of GaN-base can be laterally grown on the mask portion 5. In this case, the thickness direction (Z direction) of the first semiconductor part 8F can be the <0001> direction (c-axis direction) of the GaN-based crystal, the width direction (first direction, X direction) of each of the first and the second opening portions KF and KB having a longitudinal shape can be the <11-20> direction (a-axis direction) of the GaN-based crystal, and the longitudinal direction (Y direction) of each of the first and the second opening portions KF and KB can be the <1-100> direction (m-axis direction) of the GaN-based crystal. The first semiconductor part 8F or the first and second semiconductor parts 8F and 8B formed by the ELO method may be collectively referred to as an ELO semiconductor part (ELO semiconductor layer) 8.

The first semiconductor part 8F formed by the ELO method includes a plurality of ridge portions 8U, each of the plurality of ridge portions 8U corresponding to a respective one of the plurality of first opening portions KF. Each of the ridge portions 8U has the longitudinal direction as the Y direction. Each ridge portion 8U includes a low-defect portion (dislocation non-inheritance portion) EK having relatively few threading dislocations and a dislocation inheritance portion NS overlapping the respective one of the first opening portions KF in plan view and having relatively many threading dislocations. In forming an active layer (for example, a layer in which electrons and holes are combined) above the first semiconductor part 8F, the active layer can be provided to overlap the low-defect portion EK in plan view. In the low-defect portion EK, a non-threading dislocation density in a cross section parallel to the <0001> direction may be larger than a threading dislocation density.

The threading dislocation is a dislocation (defect) extending from the lower surface or inside to the surface or surface layer of the first semiconductor part 8F along the thickness direction (Z direction) of the first semiconductor part 8F. Cathode luminescence (CL) measurement on the surface (parallel to a c-plane) of the first semiconductor part 8F allows observation of the threading dislocation. The non-threading dislocation is a dislocation subjected to the CL measurement in a cross section parallel to the thickness direction, and is mainly a basal plane (c-plane) dislocation.

The cross section parallel to the thickness direction is, for example, the (1-100) plane (m-plane) or the (11-20) plane (a-plane).

In FIGS. 4 and 5, each of the ridge portions 8U of the first semiconductor part 8F is separated from the second semiconductor part 8B. Since each first opening portion KF is separated from the second opening portion(s) KB arranged along the edge E (closer to the edge than the first opening portion KF), even when the second semiconductor part 8B overlapping the second opening portion KB in plan view has an unintended deformed shape, the first semiconductor part 8F overlapping the first opening portion FK in plan view is less likely to meet the second semiconductor part 8B and is less likely to be affected by the second semiconductor part 8B having the unintended deformed shape. That is, the present embodiment can secure the shape of the first semiconductor part 8F by using the second semiconductor part 8B as a sacrificial layer. As illustrated in FIGS. 4 and 5, when the second semiconductor part 8B has the unintended deformed shape, the average thickness of the second semiconductor part 8B may be smaller than the average thickness of the first semiconductor part 8F due to an increase in material consumption.

For example, with a mask pattern provided with the opening portion extending in the Y direction formed from an edge to an edge of the main substrate in plan view, in film formation of the semiconductor part by the ELO method, the shape disorder of the semiconductor part in the peripheral portion may propagate to the semiconductor part on the inner side (non-peripheral portion). However, providing the second opening portion KB separated from the first opening portion KF can reduce this possibility of propagation.

Figure 6:
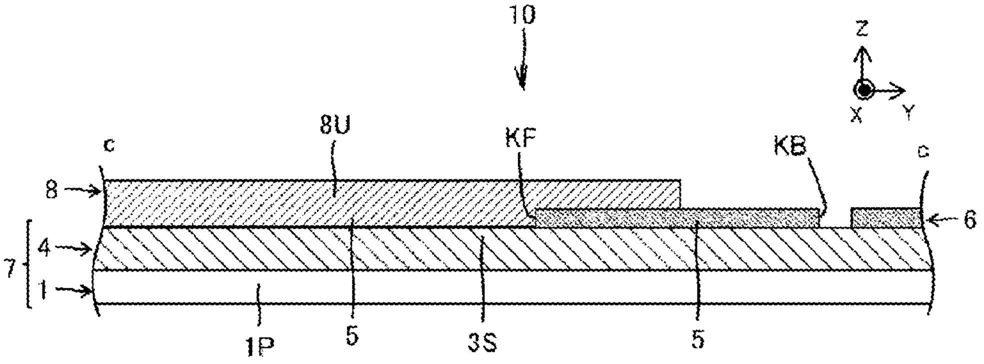
FIG. 6 is a cross-sectional view illustrating another configuration of the semiconductor substrate according to the present embodiment.

FIG. 6 is a cross-sectional view illustrating another configuration of the semiconductor substrate according to the present embodiment. As illustrated in FIG. 6, the semiconductor substrate 10 may have a configuration with the second semiconductor part 8B serving as the sacrificial layer removed.

Figure 7:
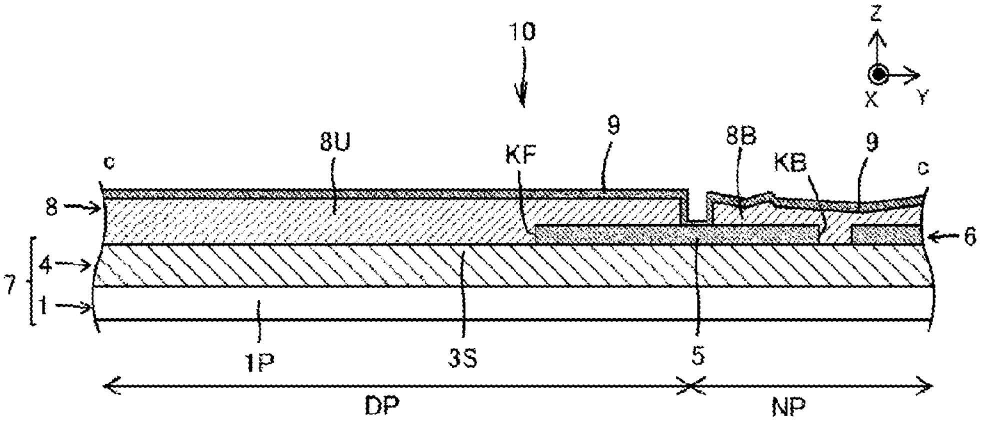
FIG. 7 is a cross-sectional view illustrating another configuration of the semiconductor substrate according to the present embodiment.

FIG. 7 is a cross-sectional view illustrating another configuration of the semiconductor substrate according to the present embodiment. The semiconductor substrate 10 in FIG. 7 includes a functional layer 9 above the first and second semiconductor parts 8F and 8B. The functional layer 9 may be, for example, a compound semiconductor part containing a nitride semiconductor, and may be a single-layer body or a laminate body.

In the semiconductor substrate 10 in FIG. 7, a portion including the second semiconductor part 8B serving as the sacrificial layer is an unusable portion NP, and a portion including the first semiconductor part 8F is a usable portion DP.

Figure 8:
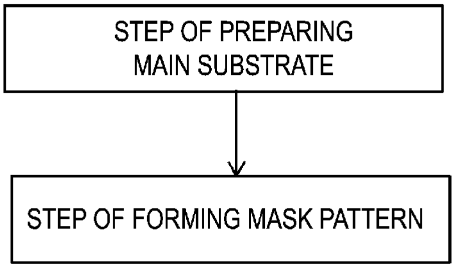
FIG. 8 is a flowchart showing an example of a manufacturing method for manufacturing the template substrate according to the present embodiment.

Manufacturing Template Substrate FIG. 8 is a flowchart showing an example of a manufacturing method for manufacturing the template substrate according to the present embodiment. In the manufacturing method for manufacturing the template substrate in FIG. 8, after a step of preparing the main substrate 1, a step of forming the mask pattern 6 above the main substrate 1 is performed.

Figure 9:
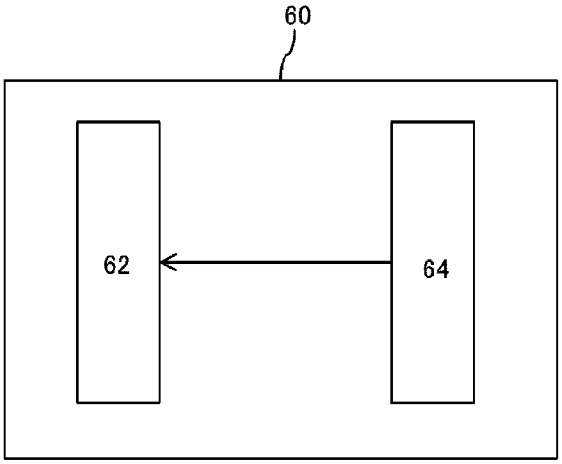
FIG. 9 is a block diagram illustrating an example of a manufacturing apparatus for manufacturing the template substrate according to the present embodiment.

FIG. 9 is a block diagram illustrating an example of a manufacturing apparatus for manufacturing the template substrate according to the present embodiment. A manufacturing apparatus 60 for manufacturing the template substrate in FIG. 9 includes a mask pattern forming unit 62 that forms the mask pattern 6 above the main substrate 1, and a controller 64 that controls the mask pattern forming unit 62. The mask pattern forming unit 62 forms the mask portion 5, the plurality of first opening portions KF each having the width direction as the X direction and the longitudinal direction as the Y direction and overlapping the non-peripheral portion 1P in plan view, and one or more second opening portions KB arranged along the edge E in plan view.

The mask pattern forming unit 62 may include a CVD device or a PECVD device, and the controller 64 may include a processor and a memory. The controller 64 may be configured to control the mask pattern forming unit 62 by executing a program stored in a built-in memory, a communicable communication apparatus, or an accessible network, for example. Such a program and a recording medium storing the program are also included in the present embodiment.

Figure 10:
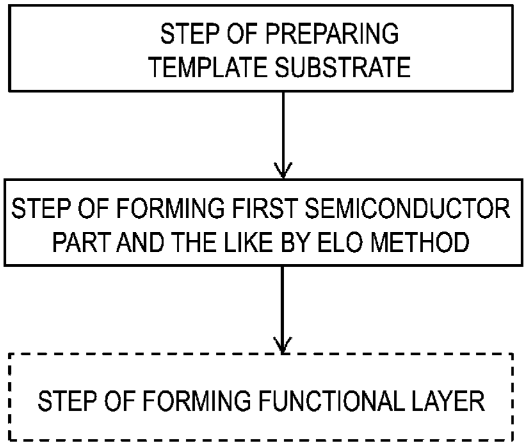
FIG. 10 is a flowchart showing an example of a manufacturing method for manufacturing the semiconductor substrate according to the present embodiment.

Manufacturing Semiconductor Substrate FIG. 10 is a flowchart showing an example of a manufacturing method for manufacturing the semiconductor substrate according to the present embodiment. In the manufacturing method for manufacturing the semiconductor substrate in FIG. 10, after a step of preparing the template substrate 7, a step of forming the first and second semiconductor parts 8F and 8B on the template substrate 7 by using the ELO method is performed. After the step of forming the first and second semiconductor parts 8F and 8B, a step of forming the functional layer 9 can be performed as necessary.

Figure 11:
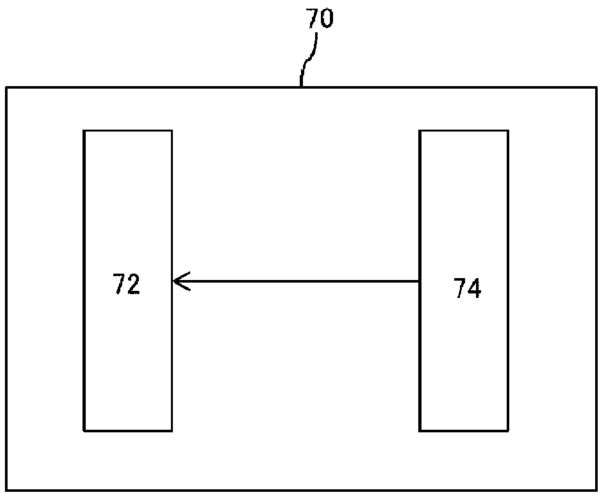
FIG. 11 is a block diagram illustrating an example of a manufacturing apparatus for manufacturing the semiconductor substrate according to the present embodiment.

FIG. 11 is a block diagram illustrating an example of a manufacturing apparatus for manufacturing the semiconductor substrate according to the present embodiment. A manufacturing apparatus 70 for manufacturing the semiconductor substrate illustrated in FIG. 11 includes a semiconductor part forming unit 72 that forms the first and second semiconductor parts 8F and 8B on the template substrate 7 by the ELO method, and a controller 74 that controls the semiconductor part forming unit 72. The manufacturing apparatus 70 for manufacturing the semiconductor substrate may be configured to form the functional layer 9.

Manufacturing Semiconductor Device

Figure 12:
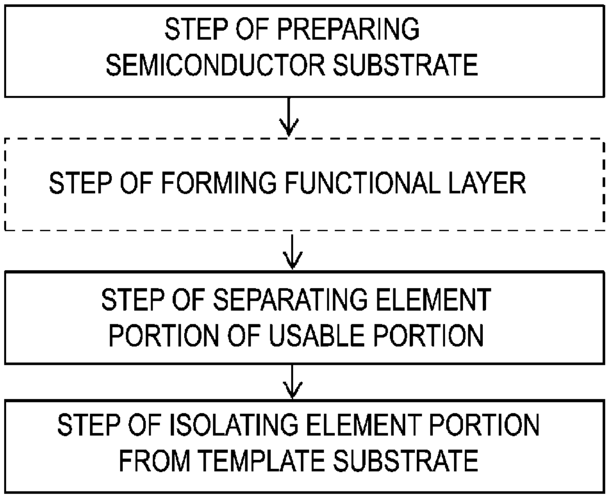
FIG. 12 is a flowchart illustrating an example of a manufacturing method for manufacturing a semiconductor device according to the present embodiment.
Figure 13:
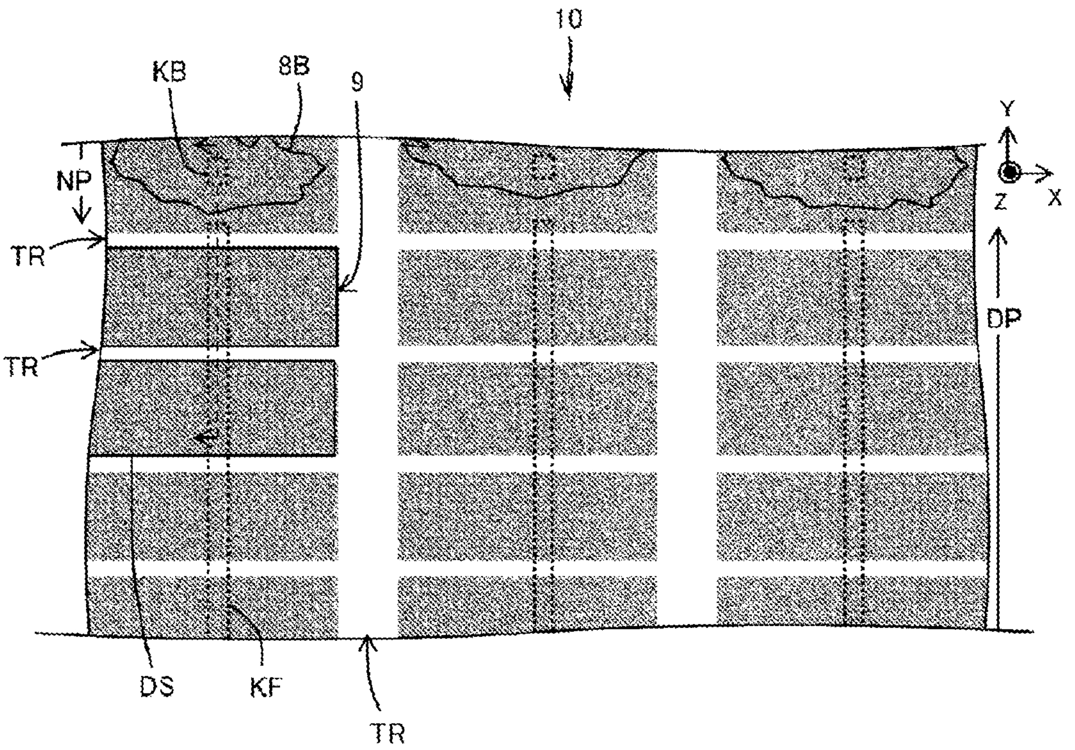
FIG. 13 is a plan view illustrating an example of separation of an element portion.
Figure 14:
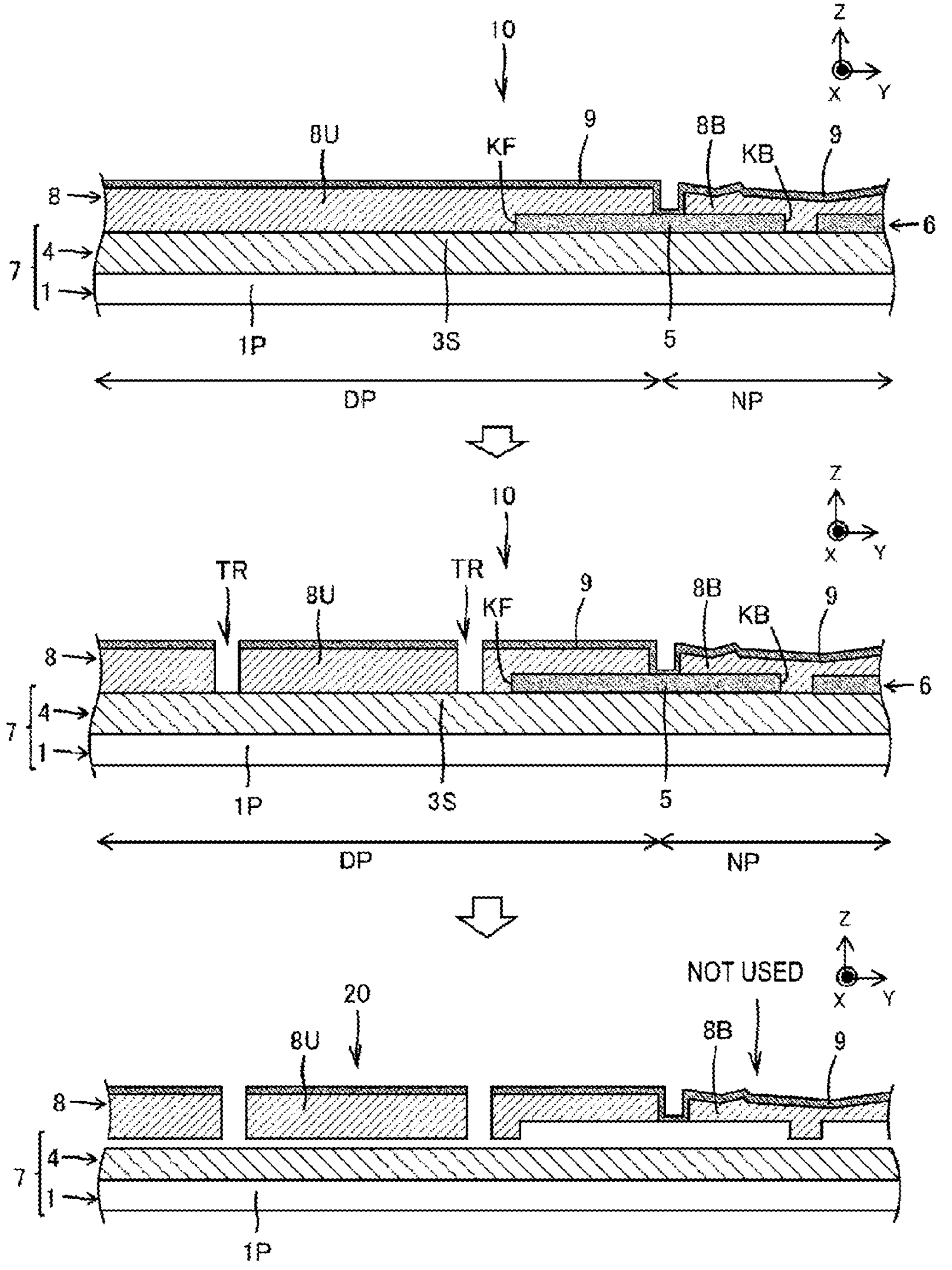
FIG. 14 is a cross-sectional view illustrating an example of separation and isolation of the element portion.

FIG. 12 is a flowchart illustrating an example of a manufacturing method for manufacturing a semiconductor device according to the present embodiment. FIG. 13 is a plan view illustrating an example of separation of an element portion. FIG. 14 is a cross-sectional view (cross-sectional view taken along an arrow in FIG. 13) illustrating an example of separation and isolation of the element portion. In the manufacturing method for manufacturing the semiconductor device in FIG. 12, after the step of preparing the semiconductor substrate 10, a step of forming the functional layer 9 on the first and second semiconductor parts 8F and 8B is performed as necessary. Thereafter, as illustrated in FIGS. 13 and 14, a step of separating element portions DS (including the low-defect portion EK of the ridge portion 8U and the functional layer 9) from each other by forming a plurality of trenches TR (separation grooves) in the semiconductor substrate 10. Each trench TR penetrates the functional layer 9 and the first semiconductor part 8F. The trench TR may expose the underlying layer 4 and the mask portion 5. At this stage, each element portion DS is bonded to the mask portion 5 by van der Waals bonding, and is part of the semiconductor substrate 10. Thereafter, as illustrated in FIG. 14, a step of isolating the element portion DS (including at least a part of the ridge portion 8U) of the usable portion DP from the template substrate 7 to obtain a semiconductor device 20 is performed. The step of preparing the semiconductor substrate 10 in FIG. 12 may include each step of the manufacturing method for manufacturing the semiconductor substrate illustrated in FIG. 10.

Note that the isolation of the element portion DS may include removing portions of the first semiconductor part 8F and the functional layer 9 overlapping the first opening portion KF in plan view by vapor phase etching and peeling off the element portion DS from the template substrate 7. In the peeling off, the first semiconductor part 8F and the functional layer 9 can be easily peeled off from the mask portion 5, for example, by using a stamp. The stamp may be a viscoelastic elastomer stamp, a polydimethylsiloxane (PDMS) stamp, an electrostatic adhesive stamp, or the like.

Semiconductor Device

As illustrated in FIG. 14, by isolating the element portion DS from the template substrate 7, the semiconductor device 20 (containing, for example, a GaN-based crystal body) can be formed. Specific examples of the semiconductor device 20 include a light emitting diode (LED), a semiconductor laser, a Schottky diode, a photodiode, and transistors (including a power transistor and a high electron mobility transistor).

Electronic Device

Figure 15:
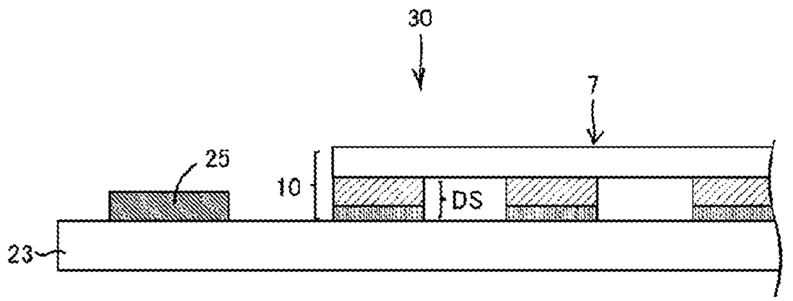
FIG. 15 is a schematic view illustrating a configuration of an electronic device according to the present embodiment.

FIG. 15 is a schematic view illustrating a configuration of an electronic device according to the present embodiment. The electronic device 30 in FIG. 15 includes the semiconductor substrate 10 (configured to function as a semiconductor device with the template substrate 7 included, for example, in a case where the template substrate 7 is light-transmissive), a drive substrate 23, on which the semiconductor substrate 10 is mounted, and a control circuit 25 that controls the drive substrate 23.

Figure 16:
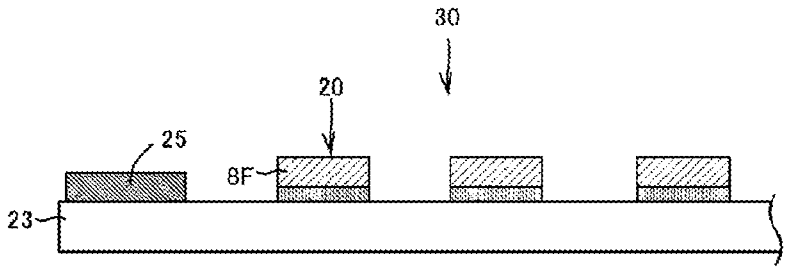
FIG. 16 is a schematic view illustrating another configuration of the electronic device according to the present embodiment.

FIG. 16 is a schematic view illustrating another configuration of the electronic device according to the present embodiment. An electronic device 30 in FIG. 16 includes the semiconductor device 20 including the first semiconductor part 8F, the drive substrate 23 with the semiconductor device 20 mounted, and the control circuit 25 that controls the drive substrate 23.

Examples of the electronic device 30 include display devices, laser emitting devices (including a Fabry-Perot type and a surface emitting type), lighting devices, communication devices, information processing devices, sensing devices, and electrical power control devices.

Example 1

Figure 17:
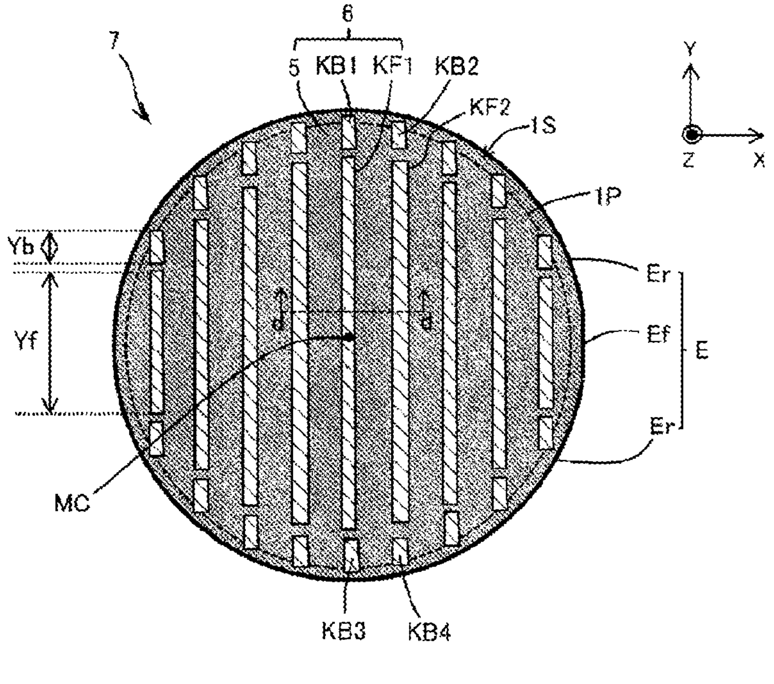
FIG. 17 is a plan view illustrating a configuration of a template substrate according to Example 1.
Figure 18:
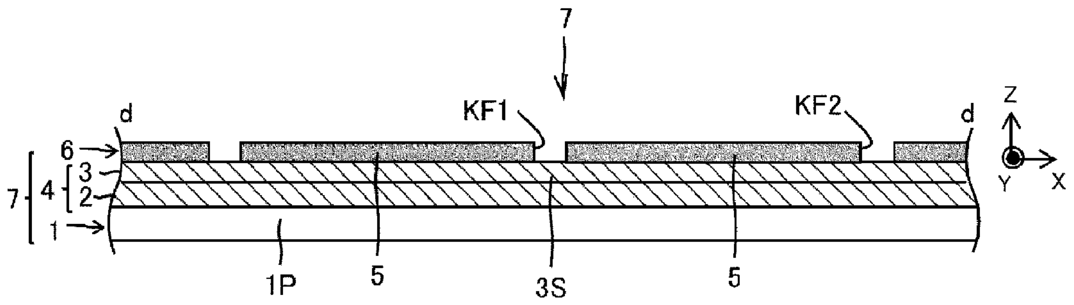
FIG. 18 is a cross-sectional view taken along an arrow line d-d illustrated in FIG. 17.
Figure 19:
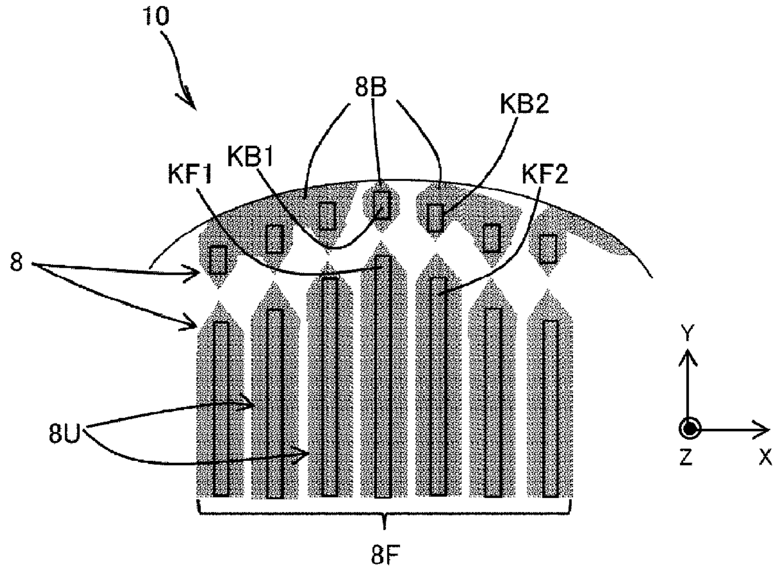
FIG. 19 is a plan view illustrating a configuration of a semiconductor substrate according to Example 1.

FIG. 17 is a plan view illustrating a configuration of a template substrate according to Example 1. FIG. 18 is a cross-sectional view taken along an arrow line d-d in FIG. 17. FIG. 19 is a plan view illustrating the configuration of the semiconductor substrate according to Example 1.

As illustrated in FIGS. 17 and 18, the mask pattern 6 of the template substrate 7 according to Example 1 includes the mask portion 5, the plurality of first opening portions KF1 and KF2 each having the width direction as the X direction and the longitudinal direction as the Y direction and overlapping the non-peripheral portion 1P in plan view, and a plurality of second opening portions KB1 to KB4 arranged along the edge E in plan view. The peripheral portion 1S may be, for example, a region of 2 [mm] or thinner from the edge E.

Main Substrate

A heterogeneous substrate different from the GaN-based semiconductor in lattice constant may be used for the main substrate 1. Examples of the heterogeneous substrate include a single crystal silicon (Si) substrate, a sapphire ($Al_2O_3$) substrate, and a silicon carbide (SiC) substrate. The plane orientation of the main substrate 1 is, for example, the (111) plane of the silicon substrate, the (0001) plane of the sapphire substrate, or the 6H—SiC (0001) plane of the SiC substrate. These are merely examples, and any main substrate and any plane orientation may be used as long as the first and second semiconductor parts 8F and 8B can be grown by the ELO method.

Underlying Layer

As the underlying layer 4, a buffer layer 2 and a seed layer 3 may be provided in order from the main substrate side. The buffer layer 2 has a function of reducing the likelihood of the main substrate 1 and the seed layer 3 coming into direct contact with each other and melting together. In a silicon substrate or the like used for the main substrate 1, the main substrate 1 and the GaN-based semiconductor serving as the seed layer 3 melt together. Thus, for example, providing the buffer layer 2 such as an AlN layer can suppress such a melting. For example, when the main substrate 1 unlikely to melt together with the seed layer 3, which is a GaN-based semiconductor, is used, a configuration may be employed in which the buffer layer 2 is not provided. The AlN layer being an example of the buffer layer 2 can be formed using a MOCVD device, for example, to have a thickness of about 10 nm to about 5 μm. The buffer layer 2 may have the effect of enhancing the crystallinity of the seed layer 3 and/or the effect of relaxing the internal stress of the ELO semiconductor part 8. Hexagonal layer system or cubic system silicon carbide (SiC) can also be used for the buffer layer 2.

A GaN-based semiconductor such as GaN, a nitride such as AlN, or hexagonal system silicon carbide (SiC), for example, can be used for the seed layer 3. The seed layer 3 includes the seed portion 3S (a growth starting point of the ELO semiconductor part 8) overlapping the first and second opening portions (KF1 to KF2 and KB1 to KB4) of the mask pattern 6.

As the seed layer 3, a graded layer in which the Al composition approaches GaN in a graded manner may be used. The graded layer is a laminate body provided with, for example, $Al_{0.7}Ga_{0.3}N$ layer as a first layer and $Al_{0.3}Ga_{0.7}N$ layer as a second layer in order from the buffer layer side. In this case, a composition ratio of Ga (0.7/2=0.35) in the second layer (Al:Ga:N=0.3:0.7:1) is larger than a composition ratio of Ga (0.3/2=0.15) in the first layer (Al:Ga:N=0.7:0.3:1). The graded layer may be easily formed by the MOCVD method and may be composed of three or more layers. Using the graded layer for the seed layer 3 allows stress from the main substrate 1 as the heterogeneous substrate to be relaxed. The seed layer 3 may include a GaN layer. In this case, the seed layer 3 may be a GaN single layer, or the uppermost layer of the graded layer as the seed layer 3 may be a GaN layer.

Note that the seed layer 3 need not be arranged on the main substrate 1. Depending on the type of the main substrate 1, film formation of the ELO semiconductor part 8 is possible directly on the main substrate 1 with the mask pattern 6 arranged, even without the seed layer. For example, with the mask pattern 6 including the mask portion 5 and the first opening portion KF formed on the SiC substrate 1, film formation of the ELO semiconductor part 8 made of GaN is possible (directly) on the mask pattern.

Mask Pattern

The first opening portion KF of the mask pattern 6 (mask layer) may have a function of a growth start hole to expose the seed portion 3S and start the growth of the ELO semiconductor part 8. The mask portion 5 may have a function of a selective growth mask to cause the semiconductor part 8 to grow in the lateral direction. The opening portion of the mask pattern is a portion with no mask portion (no-formation portion), and may be or need not be surrounded by the mask portion.

As the mask pattern 6, for example, a single-layer film including any one of a silicon oxide film (SiOx), a titanium nitride film (TiN or the like), a silicon nitride film (SiNx), a silicon oxynitride film (SiON), and a metal film (for example, a film of platinum, rhodium, iridium, ruthenium, osmium, tungsten, molybdenum, or the like) having a high melting point (for example, 1000° C. or higher), or a layered film including at least two selected from the group consisting thereof can be used.

For example, a silicon oxide film having a thickness of about 100 nm to about 4 μm (preferably from about 150 nm to about 2 μm) is formed on the entire surface of the underlying layer 4 by using sputtering, and a resist is applied onto the entire surface of the silicon oxide film. Thereafter, the resist is patterned by photolithography to form the resist having a plurality of stripe-shaped opening portions. Thereafter, a part of the silicon oxide film is removed by a wet etchant such as hydrofluoric acid (HF), buffered hydrofluoric acid (BHF), or the like to form the plurality of opening portions (including KF1 to KF2 and KB1 to KB4), and the resist is removed by organic cleaning to form the mask pattern 6.

The widths of the first opening portions KF1 and KF2 are from about 0.1 μm to about 20 μm. The smaller the widths of the first opening portions KF1 and KF2, the smaller the number of threading dislocations propagated from the first opening portions KF1 and KF2 to the ELO semiconductor part 8. This makes the peeling off (isolation) of the ELO semiconductor part 8 be easy from the template substrate 7, in a post process. Furthermore, this allows an area of the low-defect portion EK with few surface defects in the ELO semiconductor part 8 (ridge portion 8U) to be increased.

The silicon oxide film may be decomposed and evaporated in a small amount during film formation of the ELO semiconductor part 8 and may be taken into the ELO semiconductor part 8, but the silicon nitride film and the silicon oxynitride film have an advantage in terms of hardly decomposed and evaporated at a high temperature. Thus, the mask portion 5 may be a single-layer film of a silicon nitride film or a silicon oxynitride film, a layered film in which a silicon oxide film and a silicon nitride film are formed in that order on the underlying layer 4, a laminate body film in which a silicon nitride film and a silicon oxide film are formed in that order on the underlying layer 4, or a layered film in which a silicon nitride film, a silicon oxide film, and a silicon nitride film are formed in that order on the underlying layer.

An abnormal portion such as a pinhole in the mask portion 5 may be eliminated by performing organic cleaning or the like after film formation and introducing the film again into a film forming device to form the same type of film. The mask portion 5 having a high quality may be formed by using a general silicon oxide film (single layer) and using the above-described re-formation method.

In Example 1, a minimum distance between each of the plurality of first opening portions KF1 and KF2 and the edge E is longer than a distance between any of the plurality of second opening portions KB1 to KB4 and the edge E, in plan view. The plurality of first opening portions (including KF1 and KF2) with the Y direction as the longitudinal direction are aligned in the X direction, and the length thereof in the Y direction decreases with increasing distance from the main substrate center MC in the X direction. For example, the first opening portion KF2 has a long distance from the main substrate center MC in the X direction and a short length in the Y direction, compared with those of the first opening portion KF1. A minimum length Yf of each of the plurality of first opening portions (including KF1 and KF2) in the Y direction is longer than a length Yb of any of the plurality of second opening portions (including KB1 to KB4) in the Y direction. The number of the plurality of second opening portions (including KB1 to KB4) is equal to twice the number of the plurality of first opening portions (including KF1 and KF2).

The first opening portion KF1 and the second opening portion KB1 are adjacent to each other and overlap each other when viewed in the Y direction, and the first opening portion KF1 is located between the two second opening portions KB1 and KB3 arranged in the Y direction. That is, the second opening portion KB1, the first opening portion KF1, and the second opening portion KB3 are arranged in the Y direction, one end of the first opening portion KF1 is adjacent to the second opening portion KB1, and the other end of the first opening portion KF1 is adjacent to the second opening portion KB3. An interval between the first opening portion KF1 and the second opening portion KB1 and an interval between the first opening portion KF1 and the second opening portion KB3 are larger than an interval between any of the second opening portions KB1 and KB3 and the edge E. The width (length in the X direction) of each of the second opening portions KB1 and KB3 may be equal to, wider than, or narrower than the width of the first opening portion KF1. The widths of the plurality of second opening portions KB1 to KB4 may be different from each other.

In plan view, an opening pattern including the plurality of first opening portions KF1 and KF2 and the plurality of second opening portions KB1 to KB4 may have a line-symmetric shape with respect to a line that is passing through the main substrate center MC and parallel to the X direction.

In Example 1, the edge E of the main substrate 1 includes the curved surface portion Er and the flat surface portion Ef that is connected to the curved surface portion Er and has a normal line parallel to the X direction, but the configuration is not limited thereto. The main substrate 1 may have a disc shape. The flat surface portion Ef may have a function as a plane orientation indicator (orientation flat). The plane orientation indicator may be constituted by a notch.

Specific Example of Template Substrate

A silicon substrate having the (111) plane was used as the main substrate 1, and the buffer layer 2 of the underlying layer 4 was an AlN layer (for example, 30 nm). The underlying layer 4 was a graded layer in which an $Al_{0.6}Ga_{0.4}N$ layer (for example, 300 nm) as a first layer and a GaN layer (for example, from 1 μm to 2 μm) as a second layer were formed in that order. That is, the composition ratio of Ga (½=0.5) in the second layer (Ga:N=1:1) is larger than the composition ratio of Ga (0.6/2=0.3) in the first layer (Al:Ga:N=0.6:0.4:1).

As the mask portion 5, a laminate body in which a silicon oxide film ($SiO_2$) and a silicon nitride film (SiN) were formed in that order was used. The silicon oxide film had a thickness of, for example, 0.3 μm, and the silicon nitride film had a thickness of, for example, 70 nm. Each of the silicon oxide film and the silicon nitride film was film-formed by a plasma chemical vapor deposition (CVD) method.

ELO Semiconductor Part

As illustrated in FIG. 19, the semiconductor substrate 10 of Example 1 includes the first semiconductor part 8F overlapping the first opening portions KF1 and KF2 in plan view and the second semiconductor part 8B overlapping the second opening portions KB1 and KB2 in plan view. The first and second semiconductor parts 8F and 8B may be the ELO semiconductor part containing a (for example, GaN-based) nitride semiconductor.

The first semiconductor part 8F has a longitudinal direction as the Y direction and includes the plurality of ridge portions 8U arranged in the X direction. In Example 1, in which an end portion of each of the ridge portions 8U has a tapered shape, the plurality of second opening portions KB1 and KB2 are provided along the edge E. As a result, each of the ridge portions 8U of the first semiconductor part 8F is separated from the second semiconductor part 8B (sacrificial layer) having the deformed shape, and the shape (for example, thickness and width) of each of the ridge portions 8U is secured.

In Example 1, the first and second semiconductor parts 8F and 8B were GaN layers, and ELO film-formation was performed on the above-described template substrate 7 by using the MOCVD device included in the semiconductor forming unit 72 in FIG. 11. The following may be adopted as examples of the ELO film formation conditions: substrate temperature: 1120° C., growth pressure: 50 kPa, trimethylgallium (TMG): 22 sccm, $NH_3$: 15 slm, and V/III=6000 (ratio of group V raw material supply amount to group III raw material supply amount).

In this case, the first and second semiconductor parts 8F and 8B are selectively grown on the seed portion 3S (the GaN layer which is the uppermost layer of the seed layer 3) exposed in the first and second opening portions KF1, KF2, KB1, and KB2, and are subsequently laterally grown on the mask portion 5. Then, before the films (ridge portions 8U) laterally grown from both sides on the mask portion 5 met each other, the lateral growth was stopped.

A width Wm of the mask portion 5 was 50 μm, the widths of the first opening portions KF1 and KF2 were 5 μm, the lateral width of each of the ridge portions 8U of the first semiconductor part 8F was 53 μm, the width (size in the X direction) of the low-defect portion EK was 24 μm, and the layer thickness of the ridge portion 8U was 5 μm. The aspect ratio was 53 μm/5 μm=10.6, and a very high aspect ratio was achieved.

In the film formation of the first semiconductor part 8F, interaction between the first semiconductor part 8F and the mask portion 5 is preferably reduced, and the first semiconductor part 8F and the mask portion 5 are preferably in a state of being in contact with each other by van der Waals force.

A method for increasing the lateral film formation rate is as follows. First, a longitudinal growth layer that grows in the Z direction (c-axis direction) is formed on the seed portion 3S, and then a lateral growth layer that grows in the X direction (a-axis direction) is formed. In this case, the thickness of the longitudinal growth layer being 10 μm or thinner, 5 μm or thinner, 3 μm or thinner, or 1 μm or thinner allows the thickness of the lateral growth layer to be reduced so as to be thin, increasing the lateral film formation rate.

Figure 20:
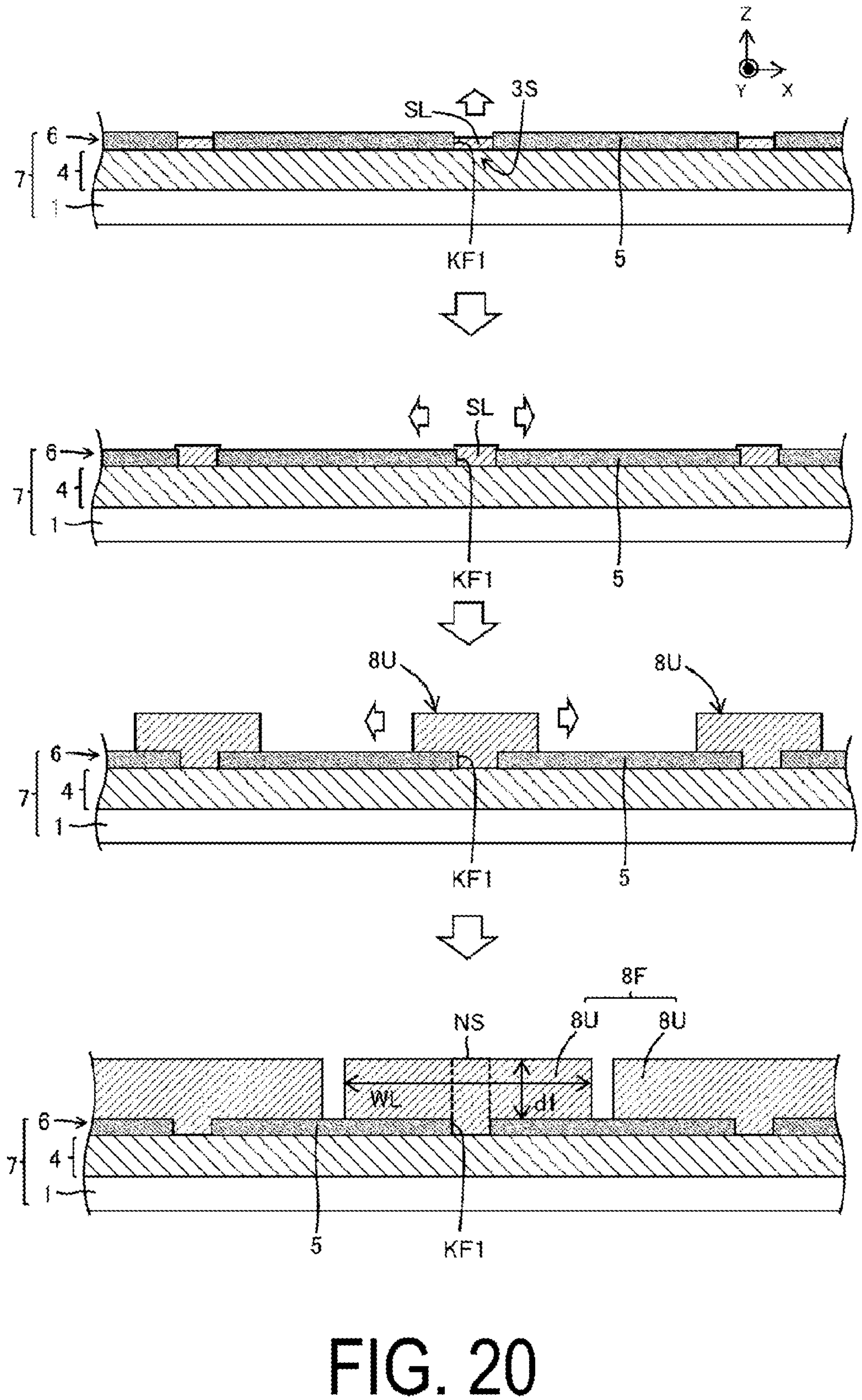
FIG. 20 is a cross-sectional view illustrating an example of a lateral growth of an ELO semiconductor part.

FIG. 20 is a cross-sectional view illustrating an example of a lateral growth of the first semiconductor part. As illustrated in FIG. 20, an initial growth layer (longitudinal growth layer) SL is formed on the seed portion 3S, and then the first semiconductor part 8F (plurality of ridge portions 8U) is desirably laterally grown from the initial growth layer SL. The initial growth layer SL serves as a start point of the lateral growth of the first semiconductor part 8F. The first semiconductor part 8F may be controlled to grow in the Z direction (c-axis direction) or in the X direction (a-axis direction) by appropriately controlling the ELO film formation conditions.

Here, a method may be used in which the film formation of the initial growth layer SL is stopped at a timing immediately before an edge of the initial growth layer SL rides on the upper surface of the mask portion 5 (at a stage of being in contact with the upper end of a side surface of the mask portion 5) or immediately after the edge of the initial growth layer SL rides on the upper surface of the mask portion 5 (that is, at this timing, the ELO film formation condition is switched from the c-axis direction film formation condition to the a-axis direction film formation condition). With this, since the lateral film formation starts from a state where the initial growth layer SL slightly protrudes from the mask portion 5, the material consumed for the growth in the thickness direction may be reduced, and the first semiconductor part 8F (plurality of ridge portions 8U) may be grown in the lateral direction at a high speed. For example, the initial growth layer SL may be formed to have a thickness of 50 nm to 5.0 μm (for example, from 80 nm to 2 μm). The thickness of the mask portion 5 and the thickness of the initial growth layer SL may be 500 nm or thinner.

By laterally growing the ridge portions 8U of the first semiconductor part 8F after film formation of the initial growth layer SL (a part of the dislocation inheritance portion NS) as illustrated in FIG. 20, the number of non-threading dislocations inside the low-defect portion EK may be increased (the threading dislocation density on the surface of the low-defect portion EK may be lowered). The distribution of the impurity concentration (for example, silicon or oxygen) inside the low-defect portion EK may be controlled. With the method in FIG. 20, the aspect ratio (ratio of the size in the X direction to the thickness=WL/d1) of each ridge portion 8U is markedly increased to 3.5 or more, 5.0 or more, 6.0 or more, 8.0 or more, 10 or more, 15 or more, 20 or more, 30 or more, or 50 or more. With the method in FIG. 20, the ratio of the width (WL) of the ridge portion 8U to the opening width may be 3.5 or more, 5.0 or more, 6.0 or more, 8.0 or more, 10 or more, 15 or more, 20 or more, 30 or more, or 50 or more, and the ratio of the low-defect portion EK may be increased. The first semiconductor part 8F illustrated in FIG. 20 may be a nitride semiconductor crystal (for example, a GaN crystal, an AlGaN crystal, an InGaN crystal, or an InAlGaN crystal).

The film formation temperature for the ELO semiconductor part 8 (the first and second semiconductor parts 8F and 8B) is preferably 1150° C. or lower, rather than a high temperature exceeding 1200° C. The ELO semiconductor part 8 may be formed even at a low temperature below 1000° C., which is more preferable from the viewpoint of reducing the interaction. In such low-temperature film formation, with trimethylgallium (TMG) as a gallium raw material, the raw material is not sufficiently decomposed, and gallium atoms and carbon atoms are simultaneously taken into the ELO semiconductor part 8 in larger quantities than usual. The reason for this may be as follows: in the ELO method, since the film formation in the a-axis direction is fast and the film formation in the c-axis direction is slow, the above atoms are taken in during the c-plane film formation in large quantities.

The carbon taken into the ELO semiconductor part 8 reduces the reaction with the mask portion 5 and reduces adhesion and the like between the mask portion 5 and the ELO semiconductor part 8. Thus, in the low-temperature film formation of the ELO semiconductor part 8, the supply amount of ammonia is reduced and the film formation is performed at about low V/III (<1000), thereby making it possible to take the carbon elements in the raw material or a chamber atmosphere into the ELO semiconductor part 8 and reduce the reaction with the mask portion 5. In this case, the ELO semiconductor part 8 contains carbon.

In the low-temperature film formation at a temperature below 1000° C., triethylgallium (TEG) is preferably used as a gallium raw material gas. Since an organic raw material is efficiently decomposed at a low temperature with TEG as compared with TMG, the lateral film formation rate may be increased.

Figure 21:
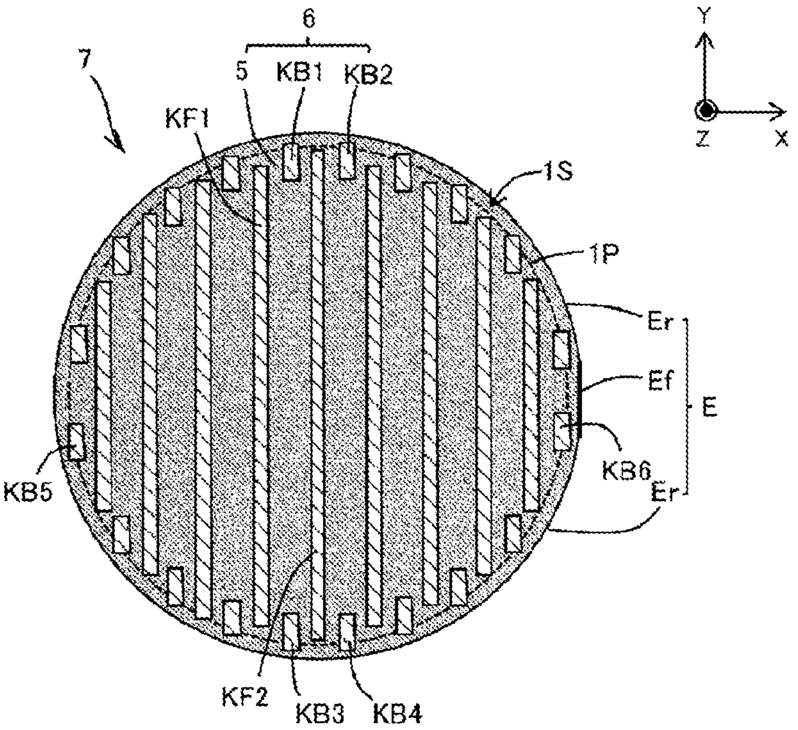
FIG. 21 is a plan view illustrating another configuration of the template substrate according to Example 1.
Figure 22:
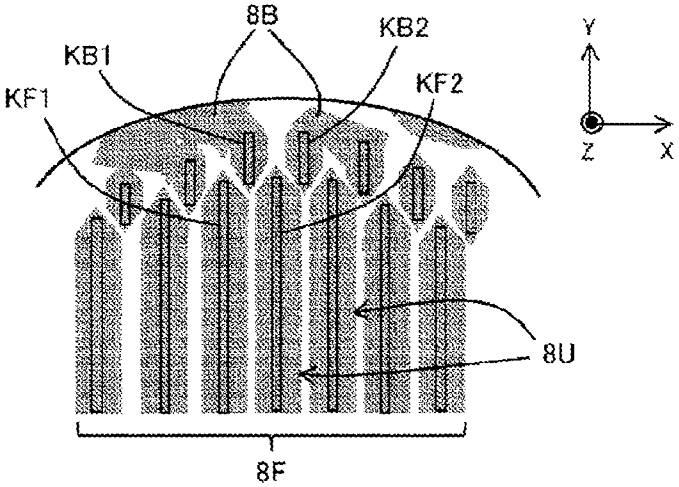
FIG. 22 is a plan view illustrating a configuration of a semiconductor substrate including the template substrate in FIG. 21.

FIG. 21 is a plan view illustrating another configuration example of the template substrate according to Example 1. FIG. 22 is a plan view illustrating a configuration of a semiconductor substrate including the template substrate in FIG. 21. In FIG. 17, the first opening portion KF1 and the second opening portion KB1 are adjacent to each other and overlap each other when viewed in the Y direction, but the configuration is not limited thereto. As illustrated in FIG. 21, the mask pattern 6 may include the plurality of first opening portions KF1 and KF2 and the second opening portions KB1 to KB6 arranged along the edge E. The first opening portion KF1 and the second opening portion KB1 may be adjacent to each other and overlap each other when viewed in the X direction. In FIG. 21, one end of the first opening portion KF2 is located between the second opening portions KB1 and KB2 arranged in the X direction, and the other end is located between the second opening portions KB3 and KB4 arranged in the X direction. The number of the plurality of second opening portions (including KB1 to KB6) is more than twice the number of the plurality of first opening portions (including KF1 and KF2). Each of the second opening portions KB5 and KB6 is located on the outer side of a respective one of the two outermost first opening portions of all the first opening portions in the X direction.

The semiconductor substrate 10 in FIG. 22 includes the first semiconductor part 8F overlapping the mask portion 5 and the first opening portions KF1 and KF2 in plan view and the second semiconductor part 8B overlapping the mask portion 5 and the second opening portions KB1 and KB2 in plan view. The first semiconductor part 8F includes the plurality of ridge portions 8U each overlapping a respective one of the first opening portions KF1 and KF2 in plan view. Also in FIGS. 11 and 22, since the plurality of second opening portions KB1 and KB2 are arranged along the edge E of the main substrate 1 in plan view, each of the ridge portions 8U of the first semiconductor part 8F is separated from the second semiconductor part 8B (sacrificial layer) having the deformed shape, and the shape of each ridge portion 8U is secured. For example, the two second opening portions KB1 and KB2 arranged in the X direction are sandwiching an end of the first opening portion KF2, allowing edge growth (protruding portion) generated at the distal end of the ridge portion 8U overlapping with the first opening portion KF2 to be reduced.

Figure 23:
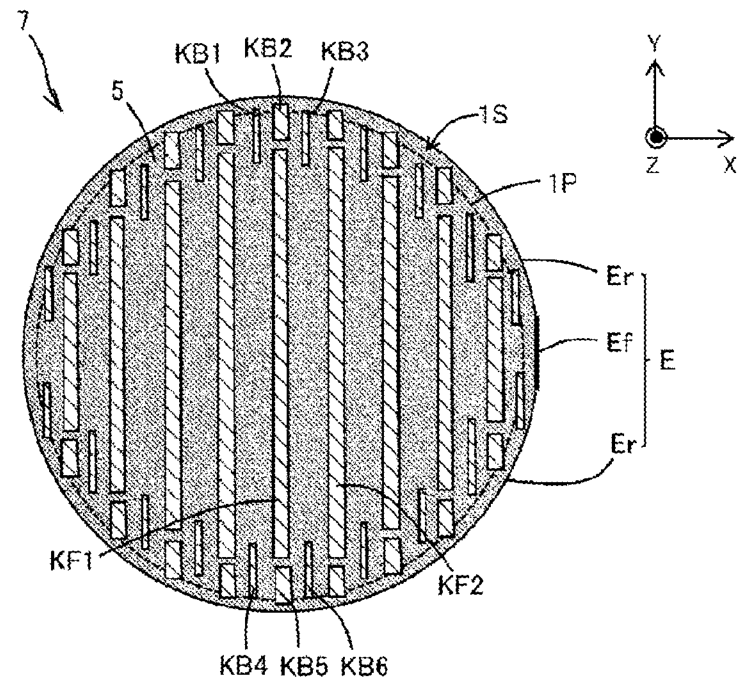
FIG. 23 is a plan view illustrating another configuration of the template substrate according to Example 1.

FIG. 23 is a plan view illustrating another configuration example of the template substrate according to Example 1. In FIG. 23, the plurality of first opening portions KF1 and KF2 and the second opening portions KB1 to KB6 arranged along the edge E of the main substrate 1 in plan view are provided in the mask pattern. The second opening portion KB2, the first opening portion KF1, and the second opening portion KB5 are arranged in the Y direction, one end of the first opening portion KF1 is adjacent to the second opening portion KB2, and the other end of the first opening portion KF1 is adjacent to the second opening KB5. Furthermore, one end of the first opening portion KF1 is located between the second opening portions KB1 and KB3 arranged in the X direction, and the other end is located between the second opening portions KB4 and KB6 arranged in the X direction.

Figure 24:
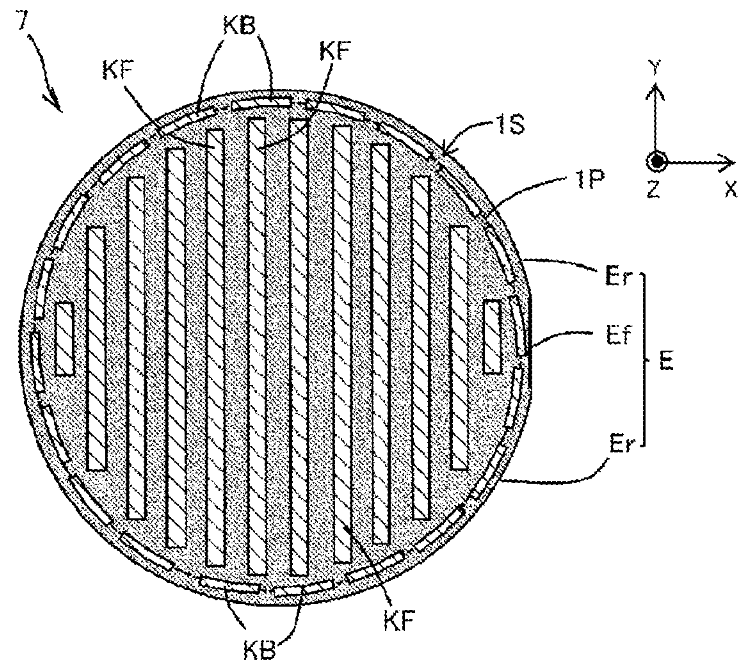
FIG. 24 is a plan view illustrating another configuration of the template substrate according to Example 1.

FIG. 24 is a plan view illustrating another configuration example of the template substrate according to Example 1. As illustrated in FIG. 24, the main substrate 1 including the curved surface portion Er may be used, and the plurality of second opening portions KB each having a curved longitudinal shape may be arranged along the edge E of the main substrate 1 in plan view in the mask pattern 6.

Example 2

Figure 25:
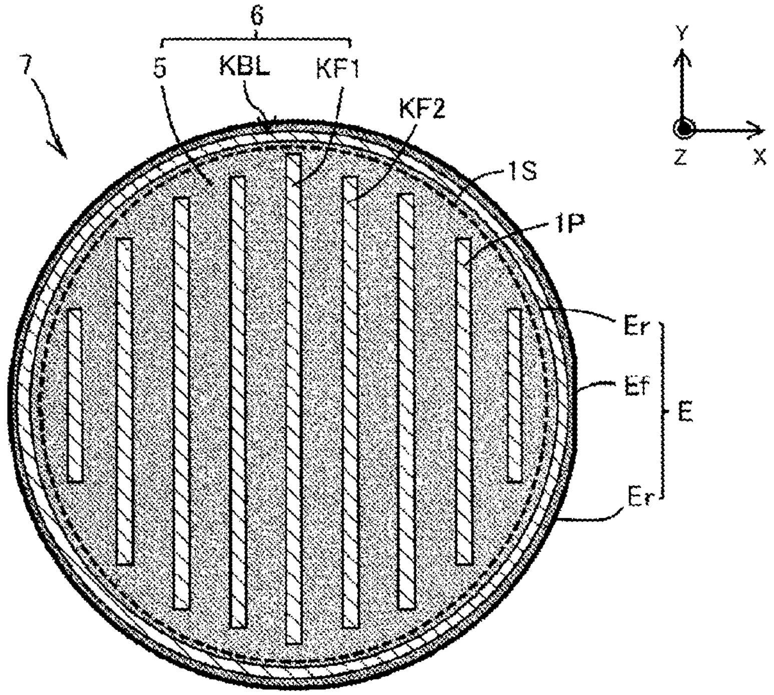
FIG. 25 is a plan view illustrating a configuration of a template substrate according to Example 2.
Figure 26:
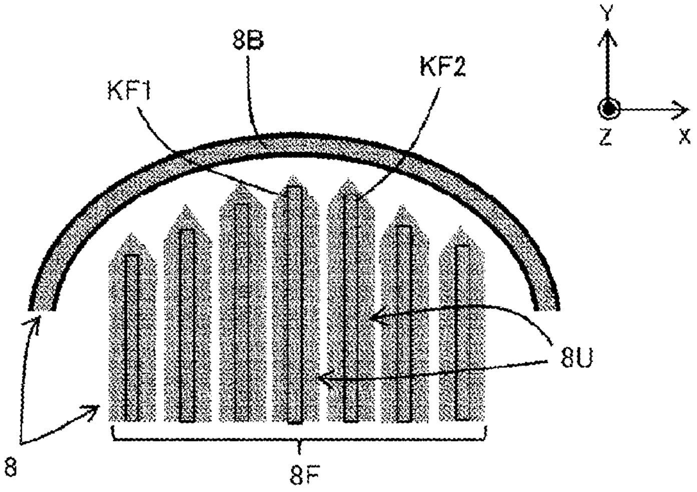
FIG. 26 is a plan view illustrating a configuration of a semiconductor substrate according to Example 2.

FIG. 25 is a plan view illustrating another configuration example of the template substrate according to Example 2. FIG. 26 is a plan view illustrating a configuration of a semiconductor substrate including the template substrate in FIG. 25. In Example 1, the plurality of second opening portions are provided in the mask pattern, but the configuration is not limited thereto. As illustrated in FIG. 26, the main substrate 1 including the curved surface portion Er may be used, and an annular second opening portion KBL may be arranged along the edge E of the main substrate 1 in plan view in the mask pattern 6.

In Example 2, the minimum distance between each of the plurality of first opening portions KF1 and KF2 and the edge E is longer than the distance between the annular second opening portion KBL and the edge E, in plan view. The plurality of first opening portions (including KF1 and KF2) with the Y direction as the longitudinal direction are aligned in the X direction, and the length thereof in the Y direction decreases with increasing distance from the main substrate center MC in the X direction.

The first opening portion KF1 and the second opening portion KBL are adjacent to each other and overlap each other when viewed in the Y direction. In plan view, an opening pattern including the plurality of first opening portions KF1 and KF2 and the annular second opening portion KBL may have a line-symmetric shape with respect to a line that is passing through the main substrate center MC and parallel to the X direction.

The semiconductor substrate 10 in FIG. 26 includes the first semiconductor part 8F overlapping the first opening portions KF1 and KF2 in plan view and the second semiconductor part 8B overlapping the second opening portion KBL in plan view, The first semiconductor part 8F includes the plurality of ridge portions 8U each overlapping a respective one of the first opening portions KF1 and KF2 in plan view.

Also in Example 2, since the annular second opening portion KBL is arranged along the edge E of the main substrate 1 in plan view, each of the ridge portions 8U of the first semiconductor part 8F is separated from the second semiconductor part 8B (sacrificial layer) having the deformed shape, and the shape of each of the ridge portions 8U is secured.

Figure 27:
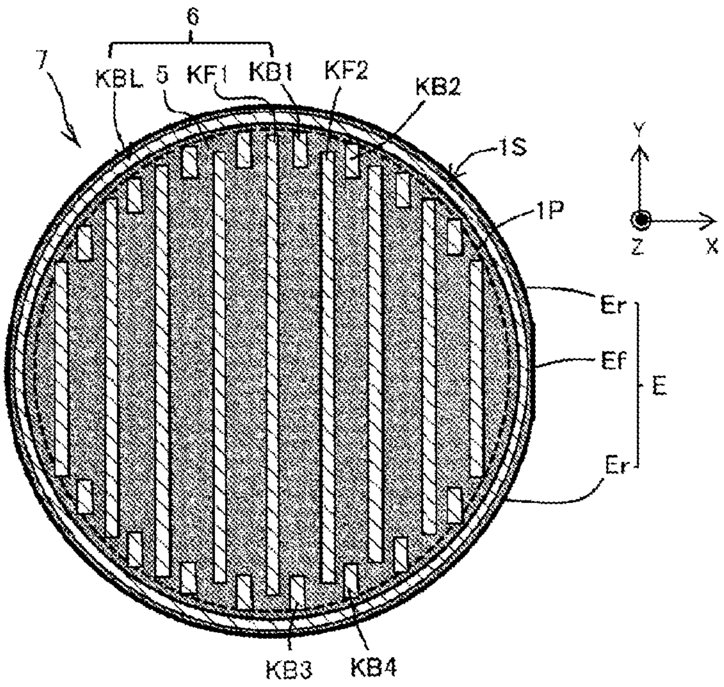
FIG. 27 is a plan view illustrating another configuration of the template substrate according to Example 2.

FIG. 27 is a plan view illustrating another configuration example of the template substrate according to Example 2. In FIG. 27, the mask pattern 6 may include the plurality of first opening portions KF1 and KF2 and the annular second opening portion KBL arranged along the edge E, and the second opening portions KB1 to KB4 arranged along the edge E. The first opening portion KF1 and the second opening portion KB1 may be adjacent to each other and overlap each other when viewed in the X direction. In FIG. 27, one end of the first opening portion KF2 is located between the second opening portions KB1 and KB2 arranged in the X direction, and the other end is located between the second opening portions KB3 and KB4 arranged in the X direction. The number of the plurality of second opening portions (including KB1 to KB4) is less than twice the number of the plurality of first opening portions (including KF1 and KF2). The second opening portion having an island shape does not exist but only the annular second opening portion KBL exists on the outer side of the two outermost first opening portions of all the first opening portions in the X direction.

Figure 28:
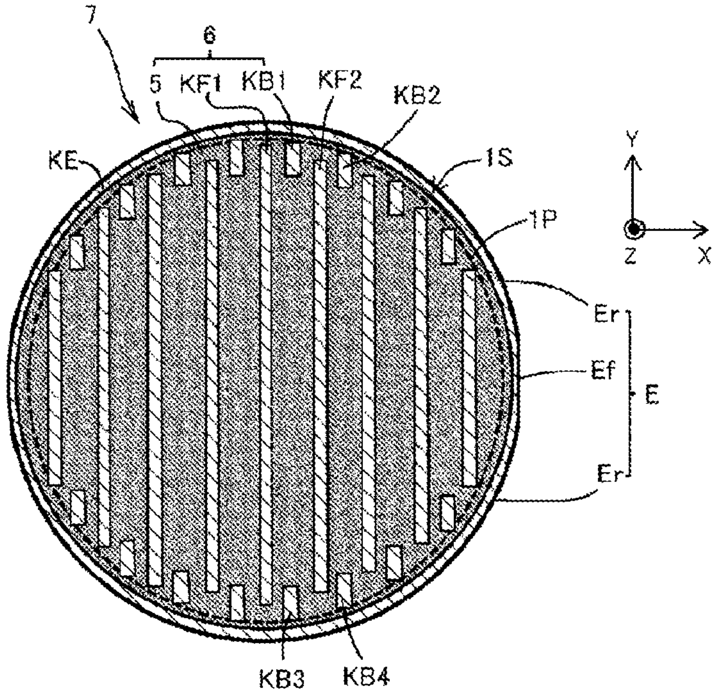
FIG. 28 is a plan view illustrating another configuration of the template substrate according to Example 2.

FIG. 28 is a plan view illustrating another configuration example of the template substrate according to Example 2. In FIG. 27, the mask portion 5 exists at the edge of the template substrate 7, but the configuration is not limited thereto. As illustrated in FIG. 28, the mask portion need not exist at the edge of the template substrate 7. That is, at the time of patterning the mask pattern 6, the seed portion 3S having a ring shape is exposed at the edge of the template substrate 7 by penetrating a ring-shaped region with the edge E of the main substrate 1 as an outer periphery in plan view (providing an edge opening portion KE having a ring shape). In FIG. 28, since the annular sacrificial layer is formed on the edge of the template substrate 7, the shape of the first semiconductor part 8F overlapping the first opening portions KF1 and KF2 is secured.

Example 3

In Examples 1 and 2, the ELO semiconductor part 8 is a GaN layer, but the configuration is not limited thereto. An InGaN layer, which is the GaN-based semiconductor part, can also be formed as the first and second semiconductor parts 8F and 8B (ELO semiconductor part 8) of Examples 1 and 2. The lateral film formation of the InGaN layer is carried out at a low temperature below 1000° C., for example. This is because the vapor pressure of indium increases at a high temperature and indium is not effectively taken into the film. When the film formation temperature is low, an effect is exhibited in which the interaction between the mask portion 5 and the InGaN layer is reduced. The InGaN layer has an effect of exhibiting lower reactivity with the mask portion 5 than the GaN layer. When indium is taken into the InGaN layer at an In composition level of 1% or more, the reactivity with the mask portion 5 is further lowered, which is desirable. As the gallium raw material gas, triethylgallium (TEG) is preferably used.

Example 4

Figure 29:
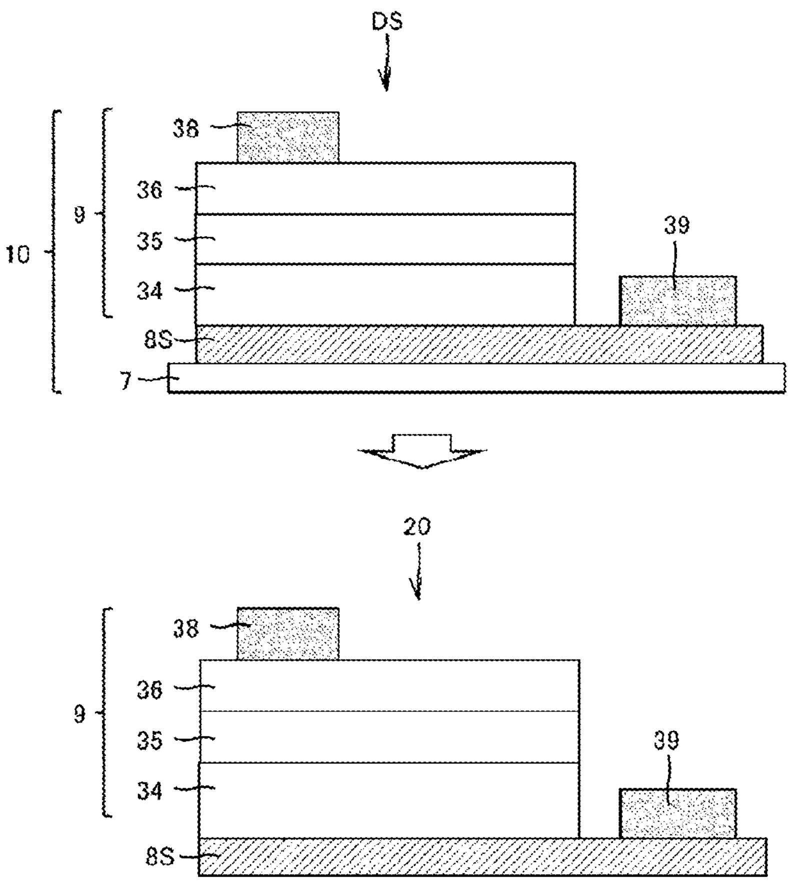
FIG. 29 is a schematic cross-sectional view illustrating a configuration of Example 4

FIG. 29 is a schematic cross-sectional view illustrating a configuration of Example 4. In Example 4, the functional layer 9 constituting the LED is film-formed on a base semiconductor part 8S obtained as all or a part of the ridge portion 8U of the first semiconductor part 8F. The base semiconductor part 8S is an n-type layer doped with, for example, silicon. The functional layer 9 includes an active layer 34, an electron blocking layer 35, and a GaN-based p-type semiconductor part 36 in order from the bottom layer side. The active layer 34 is a multi-quantum well (MQW), and includes an InGaN layer and a GaN layer. The electron blocking layer 35 is, for example, an AlGaN layer. The GaN-based p-type semiconductor part 36 is, for example, a GaN layer. An anode 38 is arranged to be in contact with the GaN-based p-type semiconductor part 36, and a cathode 39 is arranged to be in contact with the base semiconductor part 8S. By isolating the base semiconductor part 8S and the functional layer 10 from the template substrate 7, the semiconductor device 20 (containing the GaN-based crystal body) can be obtained.

Figure 30:
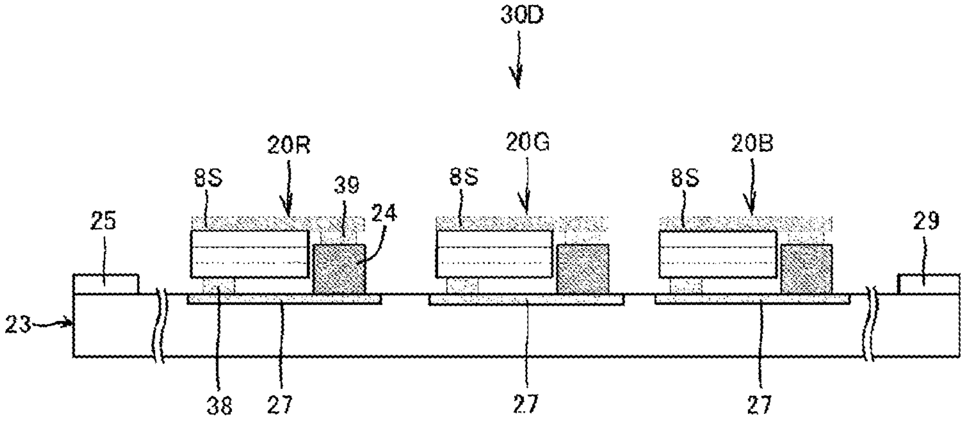
FIG. 30 is a cross-sectional view illustrating an application example of Example 4 to an electronic device.

FIG. 30 is a cross-sectional view illustrating an application example of Example 6 to an electronic device. According to Example 4, a red micro LED 20R, a green micro LED 20G, and a blue micro LED 20B may be obtained, and a micro LED display 30D (electronic device) may be constituted by mounting these LEDs on the drive substrate (TFT substrate) 23. As an example, each of the red micro LED 20R, the green micro LED 20G, and the blue micro LED 20B is mounted on a respective one of a plurality of pixel circuits 27 of the drive substrate 23 via a conductive resin 24 (for example, an anisotropic conductive resin) or the like, and then a control circuit 25, a driver circuit 29, and the like are mounted on the drive substrate 23. The drive substrate 23 may include a part of the driver circuit 29.

Example 5

Figure 31:
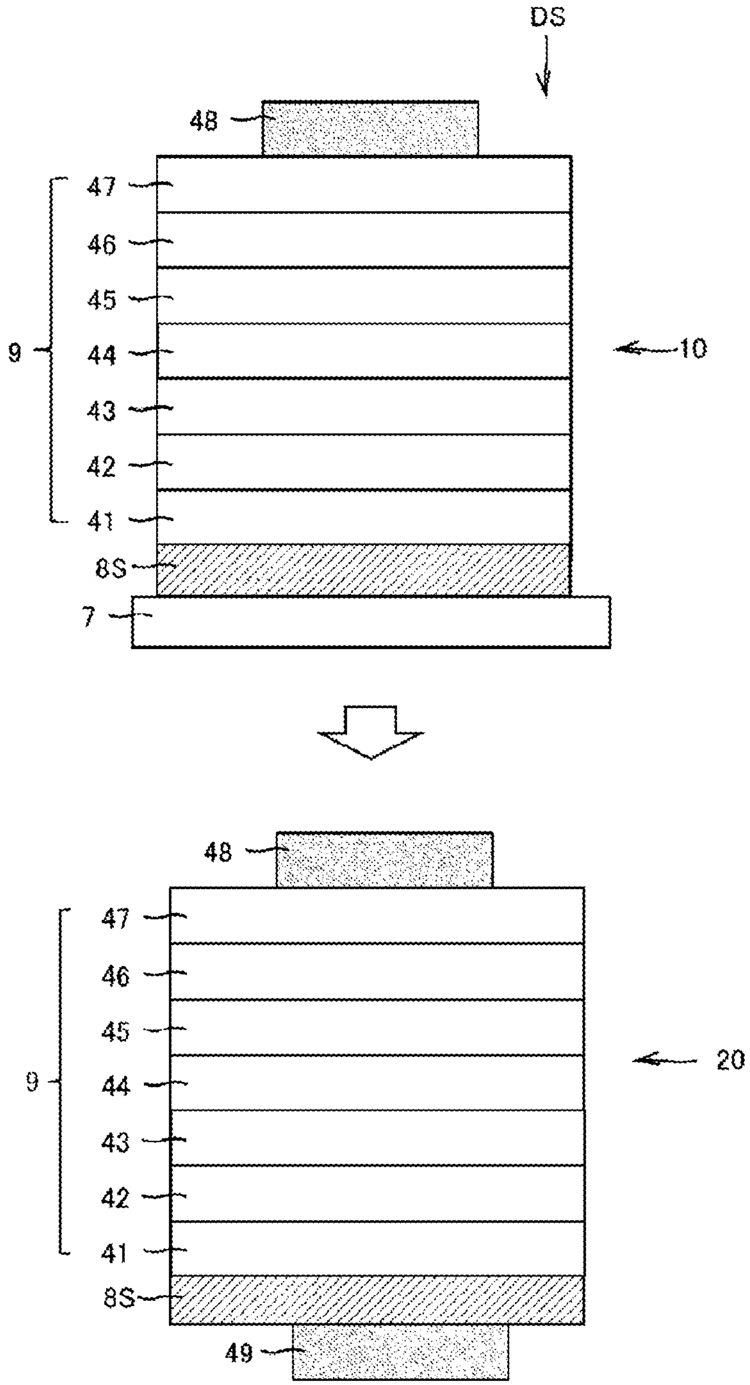
FIG. 31 is a schematic cross-sectional view illustrating a configuration of Example 5.

FIG. 31 is a schematic cross-sectional view illustrating a configuration of Example 5. In Example 5, the functional layer 9 constituting a semiconductor laser is film-formed on the base semiconductor part 8S. The functional layer 9 includes an n-type light cladding layer 41, an n-type light guide layer 42, an active layer 43, an electron blocking layer 44, a p-type light guide layer 45, a p-type light cladding layer 46, and a GaN-based p-type semiconductor part 47 in order from the bottom layer side. For each of the guide layers 42 and 45, an InGaN layer may be used. A GaN layer or AlGaN layer may be used for each of the cladding layers 41 and 46. An anode 48 is arranged to be in contact with the GaN-based p-type semiconductor part 47 and a cathode 49 is arranged to be in contact with the base semiconductor part 8S. By isolating the base semiconductor part 8S and the functional layer 10 from the template substrate 7, the semiconductor device 20 can be obtained.

Example 6

Figure 32:
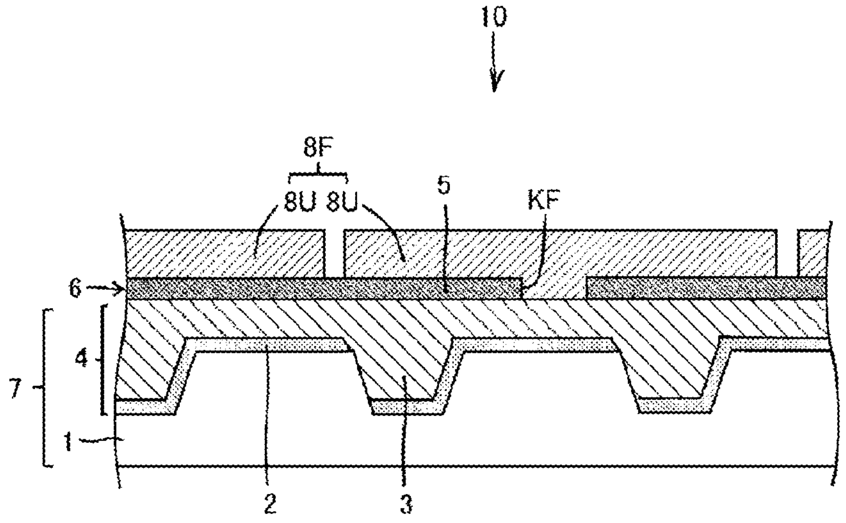
FIG. 32 is a cross-sectional view illustrating a configuration of Example 6.

FIG. 32 is a cross-sectional view illustrating a configuration of Example 6. In Example 6, a sapphire substrate having an uneven surface is used for the main substrate 1. The underlying layer 4 includes the buffer layer 2 and the seed layer 3. In FIG. 32, a GaN layer having the (20-21) plane is film-formed as the underlying layer 4 on the main substrate 1. In this case, the first semiconductor part 8F is the (20-21) plane, which is a crystal principal plane, in the underlying layer 4, and the first semiconductor part 8F of a semipolar surface may be obtained. By providing a functional layer for a laser or an LED on the semipolar surface, an advantage is obtained in that the probability of recombination of electrons and holes is increased in the active layer. Note that a GaN layer having the (11-22) plane may be film-formed as the underlying layer 4 on the main substrate 1 by using a sapphire substrate having an uneven surface.

REFERENCE SIGNS

1 Main substrate
2 Buffer layer
3 Seed layer
3S Seed portion
4 Underlying layer
5 Mask portion
6 Mask pattern
8F First semiconductor part
8B Second semiconductor part
8U Ridge portion

9 Functional layer
10 Semiconductor substrate
20 Semiconductor device
30 Electronic device
KF, KF1, KF2 First opening portion
KB, KB1 to KB6 Second opening portion

The invention claimed is:

1. A template substrate comprising:

a main substrate comprising an edge, a peripheral portion comprising the edge, and a non-peripheral portion located on an inner side of the peripheral portion;

a mask pattern located above the main substrate, wherein the mask pattern comprises a mask portion, a plurality of first opening portions each having a width direction as a first direction and a longitudinal direction as a second direction and overlapping the non-peripheral portion in plan view, and one or more second opening portions arranged along the edge in plan view; and a seed layer overlapping the plurality of first opening portions in plan view.

2. The template substrate according to claim 1, wherein at least one of the plurality of first opening portions and at least one of the second opening portions are adjacent to each other and overlap with each other when viewed in the second direction.

3. The template substrate according to claim 2, wherein at least one of the plurality of first opening portions is located between two second opening portions arranged in the second direction.

4. The template substrate according to claim 3, wherein a distance between at least one of the plurality of first opening portions and one of the two second opening portions is longer than a distance between the one of the two second opening portions and the edge in plan view.

5. The template substrate according to claim 1, wherein at least one of the plurality of first opening portions and at least one of the second opening portions are adjacent to each other and overlap with each other when viewed in the first direction.

6. The template substrate according to claim 1, wherein the plurality of first opening portions are arranged in the first direction.

7. The template substrate according to claim 1, wherein the edge comprises a curved surface portion.

8. The template substrate according to claim 1, wherein one of the one or more second opening portions has an annular shape.

9. The template substrate according to claim 1, wherein the peripheral portion is a region of 2 mm or less from the edge.

10. The template substrate according to claim 1, wherein the main substrate is a silicon substrate.

11. The template substrate according to claim 1, wherein the template substrate is used for forming a GaN-based semiconductor part by ELO formation.

12. A semiconductor substrate comprising:

the template substrate according to claim 1; and a first semiconductor part overlapping with the mask portion.

13. The semiconductor substrate according to claim 12, further comprising:

a second semiconductor part overlapping the one or more second opening portions in plan view, wherein the first semiconductor part overlaps the plurality of first opening portions.

14. The template substrate according to claim 1, wherein the seed layer is located between the main substrate and the mask pattern.

15. The template substrate comprising:

a main substrate comprising an edge, a peripheral portion comprising the edge, and a non-peripheral portion located on an inner side of the peripheral portion; and a mask pattern located above the main substrate, wherein the mask pattern comprises a mask portion, a plurality of first opening portions each having a width direction as a first direction and a longitudinal direction as a second direction and overlapping the non-peripheral portion in plan view, and one or more second opening portions arranged along the edge in plan view, the plurality of first opening portions are arranged in the first direction, and the plurality of first opening portions comprise two first opening portions having distances different from each other in the first direction from a center of the main substrate, and one of the two first opening portions has the distance longer and a length in the second direction shorter than that of the other one of the two first opening portions.

16. The template substrate according to claim 15, wherein a minimum length of the plurality of first opening portions in the second direction is longer than a length of any of the one or more second opening portions in the second direction.

17. The semiconductor substrate comprising:

a template substrate comprising:

a main substrate comprising an edge, a peripheral portion comprising the edge, and a non-peripheral portion located on an inner side of the peripheral portion; and a mask pattern located above the main substrate, wherein the mask pattern comprises a mask portion, a plurality of first opening portions each having a width direction as a first direction and a longitudinal direction as a second direction and overlapping the non-peripheral portion in plan view, and one or more second opening portions arranged along the edge in plan view;

a first semiconductor part overlapping with the mask portion; and a second semiconductor part overlapping the one or more second opening portions in plan view, wherein the first semiconductor part overlaps the plurality of first opening portions, and the first semiconductor part and the second semiconductor part are separated from each other.

18. The semiconductor substrate according to claim 17, wherein the first semiconductor part contains a GaN-based semiconductor, and the main substrate is a heterogeneous substrate different from the GaN-based semiconductor in terms of lattice constant.

19. The semiconductor substrate according to claim 17, wherein the first semiconductor part contains a GaN-based semiconductor, and the first direction is the <11-20> direction of the GaN-based semiconductor, and the second direction is the <1-100> direction of the GaN-based semiconductor.

* * * * *